United States Patent [19]

Nakajima et al.

[11] Patent Number: 4,774,200
[45] Date of Patent: Sep. 27, 1988

[54] SCHOTTKY-GATE FIELD EFFECT TRANSISTOR AND METHOD FOR PRODUCING THE SAME

[75] Inventors: Shigeru Nakajima; Toshiki Ebata, both of Osaka, Japan

[73] Assignee: Sumitomo Electric Industries, Ltd., Osaka, Japan

[21] Appl. No.: 844,477

[22] Filed: Mar. 26, 1986

[30] Foreign Application Priority Data

Mar. 26, 1985 [JP] Japan .................. 60-63096

[51] Int. Cl.$^4$ .......................... H01L 29/80
[52] U.S. Cl. ...................... 437/39; 437/175; 156/643; 357/22
[58] Field of Search ............ 357/15, 22 I, 22 J; 437/175, 176, 177, 178, 179, 39; 156/643

[56] References Cited

U.S. PATENT DOCUMENTS

| | | | |
|---|---|---|---|
| 4,099,305 | 7/1978 | Cho et al. | 29/579 |
| 4,171,234 | 10/1979 | Nagata et al. | 148/175 |
| 4,309,267 | 1/1982 | Boyd et al. | 204/298 |
| 4,325,181 | 4/1982 | Yoder | 29/571 |
| 4,379,005 | 4/1983 | Hovel et al. | 148/187 |
| 4,404,732 | 9/1983 | Andrade | 437/176 |
| 4,559,238 | 12/1985 | Bujatti et al. | 437/176 |
| 4,640,003 | 2/1987 | Papanicolaou | 437/39 |

FOREIGN PATENT DOCUMENTS

57-73975 5/1982 Japan.
58-178567 10/1983 Japan.

OTHER PUBLICATIONS

Yokoyama et al., Digest of Technical Papers, IEEE Inter'l Solid State Circuits Conf., 1981, pp. 218-219.
Yamasaki et al., Electronics Letters, vol. 18, pp. 119-121 (1982).

Primary Examiner—Olik Chaudhuri
Attorney, Agent, or Firm—Kenyon & Kenyon

[57] ABSTRACT

A Schottky-gate field effect transistor comprises a substrate, an active layer formed in one surface of the substrate, a Schottky gate electrode in the form of an inverted trapezoid on the active layer. A heavily doped region is formed in the one surface of the substrate at each side of the inverted trapezoid Schottky gate electrode separately from the side edge of the bottom of the Schottky gate electrode by a certain distance but in self-alignment with the corresponding side edge of the top of the inverted trapezoid Schottky gate electrode. Source and drain electrodes are respectively formed on the heavily doped regions in ohmic contact thereto in such a manner that the edge of each of the source and drain electrodes close to Schottky gate electrode is in alignment with the corresponding side edge of the top of the inverted-trapezoid gate electrode.

5 Claims, 3 Drawing Sheets

SCHOTTKY-GATE FIELD EFFECT TRANSISTOR AND METHOD FOR PRODUCING THE SAME

BACKGROUND OF THE INVENTION

1. Field of the Invention

The present invention relates to a field effect transistor, and more particularly to a Schottky-gate field effect transistor capable of operating at a high speed and in a high frequency band.

2. Description of Related Art

Metal semiconductor field effect transistors or Schottky-gate field effect transistors (hereinafter abbreviated "MESFET") have been widely and praisefully used as an amplification or oscillation circuit element for their excellent performance especially in the range of super-high frequency. Also, these semiconductor devices have been built in super-high speed integrated circuits, and their excellent performance is well known.

FIG. 1 shows the structure of a MESFET which is used most widely. As shown in the drawing, a semiconductor crystal layer 22 having a relatively high conductivity (commonly called "active layer") is formed on a high-resistive resistive or semi-insulative semiconductor crystal substrate 21, and a Schottky-contact gate electrode 23 (commonly called "Schottky gate electrode"), an ohmic-contact source electrode 24 and an ohmic-contact drain electrode 25 are formed on the surface of the active layer 22. In operation, the thickness of the depletion region 26 expanding downward from the Schottky gate electrode 23 is controlled by varying the voltage applied to the Schottky gate electrode 23, thereby controlling the electric current flowing from the source electrode 24 to the drain electrode 25.

Transconductance "$g_m$" and cutoff frequency "$f_T$" are used as the figures of merit of a MESFET. These figures of merit are given by $$g_m = \frac{\epsilon \mu Z}{a \cdot Lg} (Vg - Vth); \text{ and}$$

$$f_T = \frac{g_m}{2\pi Cgs},$$

where "Lg" stands for the length of the gate electrode; "Z" for the width of the gate electrode; "$\mu$" for the mobility of carriers; "a" for the thickness of the active layer; "$\epsilon$" for the dielectric constant of the semiconductor; "Vg" for the voltage applied to the gate electrode; "Vth" for the threshold voltage of the MESFET and "Cgs" for the capacitance appearing between the gate and source electrodes.

The performance of a MESFET will be improved with the increase of "$g_m$" and "$f_T$".

As is apparent from the above mathematical statements, transconductance "$g_m$" can be increased by shortening the gate length "Lg". Simultaneously, the capacitance "Cgs" between the gate and source electrodes of the semiconductor device decreases, and hence the cutoff frequency increases.

Incidentally, in the structure of the MESFET as shown in FIG. 2, a parasitic series resistance "Rs" appears between the source and Schottky gate electrodes of the semiconductor device, and if the parasitic resistance "Rs" is large, the electric field "E" between these electrodes will decrease because of a large voltage drop occurring across the parasitic resistance "Rs", accordingly lowering the transconductance "$g_m$". In general, the transconductance "$g_m$" is given by:

$$g_m = \frac{g_{mo}}{(1 + Rs\, g_{mo})},$$

where "$g_{mo}$" stands for an intrinsic transconductance which would appear if there were no parasitic series resistance "Rs".

It is found that GaAs and any other semiconductor material which has elevated surface states are liable to cause a relatively high parasitic resistance "Rs" to appear.

As is apparent from the above, the performance of a MESFET can be improved by shortening the gate length "Lg" of the device and by reducing the parasitic series resistance "Rs" between the source and Schottky gate of the semiconductor device. In an attempt to reduce the gate length of the device, it has been proposed that:

(1) use is made of a submicron resist pattern prepared by a direct electron beam lithography.

Also, in an attempt to reduce the parasitic series resistance "Rs" between the source and Schottky gate electrodes, a variety of arts have been proposed:

(2) the region other than the Schottky gate electrode is ion-implanted for activations;

(3) a refractory Schottky gate is formed on a substrate, and then the substrate is subjected to ion-implantation by using the gate electrode as mask for self-alignment (See N. YOKOYAMA, ISSCC Digest of Technical Page, P. 218, 1981);

(4) necessary ion-implantation is effected by using a dummy gate electrode as a mask, and then the pattern is reversely replicated to form a Schottky gate electode (See K. Yamasaki, Electronics Letters Vol. 18, p. 120); and (5) the distance between the source and Schottky gate electrodes is reduced (A. Higashisaka, Extended Abstracts of the 15th conf. on Solid State Device & Material, 1983, p. 69).

Some details of these proposals (2) to (5) are given below:

As regards Proposal (2), a semiconductor substrate is ion-implanted with impurities, and then the semiconductor substrate is subjected to annealing, thereby activating the impurity in the semiconductor substrate to provide relatively high conductive regions, resulting in decrease of the parasitic series-resistance "Rs" between the source and Schottky electrodes of the semiconductor device.

As regards Proposal 3, as shown in FIG. 2, a refractory gate metal 27 is formed on the surface of the active layer 22, and an ion-implantation is effected by using the gate metal 27 as a mask. Then, the semiconductor substrate thus ion-implanted is subjected to annealing, and thereafter source and drain electrodes are formed.

As for Proposal 4, as shown in FIG. 3, a dummy gate 28 which is made of a material appropriate for the purpose of masking for later ion-implantation, is formed on the active layer 22. The semiconductor substrate is heavily ion-implanted with impurity, and then it is annealed. Thereafter, patterning is reversed to form source and drain electrodes first, and a Schottky gate electrode next.

As for Proposal 5, as shown in FIG. 4, a Schottky gate electrode 23 is formed on the active layer 22, and then the whole upper surface of the semiconductor substrate is coated with an insulation material 30. The insulation coating 30 is removed from the upper surface of the semiconductor substrate other than the side wall of the Schottky gate electrode 23. Then, the whole upper surface of the semiconductor substrate is coated with an ohmic-contact metal 31, and finally, source and drain electrodes are formed by removing the metal from the outside of the Schottky electrode.

Since isotropic insulation coating is used as a matter of course, the outside of the Schottky gate electrode should be coated with an insulating material as thick as the flat surface of the semiconductor substrate. Also, as a matter of concern anisotropic etching such as reactive ion-etching should be used, assuring that the insulation coating be removed only the from the horizontal surface of the semiconductor substrate, leaving the insulation coating around the Schottky gate electrode. Thus, the source and drain electrodes are separated from the Schottky gate electrode by the thickness of the insulation coating. Eventually, they are brought as close as practically possible to the Schottky gate.

However, Proposal 1 requires advanced technique, and as a matter of fact its throughput is low, not permitting the reduction to practical use.

Specifically, the proposed method cannot be applied to a substrate having a relatively high resistance such as a GaAs substrate without using certain special arts. Accordingly, application of the same is limited.

Proposal 2 has following defects: ion-implantation and subsequent activation are liable to cause the high-concentration region to expand as far as the Schottky gate electrode, thereby lowering the yielding voltage of the Schottky gate, and increasing the capacitance between the source and Schottky gate electrodes. Accordingly, the performance of such MESFET lowers. These defects, however, can be reduced by performing necessary patterning alignment on registration with exactness. Optical exposing apparatus now available, however, cannot permit such exact alignment or registration required.

Proposal 3 reduces the difficulty of patterning alignment or registration to possible minimum with recourse to self-alignment or registration. The proposed method, however, requires ion-implantation and subsequent annealing, which is effected after forming a Schottky gate electrode. In annealing the semi-fabricated device is heated at an elevated temperature. This disadvantageously limits the kinds of material of which the Schottky gate is made.

Proposal 4 is advantageously free of the difficulty of patterning alignment or registration, as is the case with Proposal 3. Also, advantageously the Schottky gate electrode is formed after annealing, thus putting no limitation to the selection of the material of which the Schottky gate is made. However, patterning reversal requires complicated processes, and still disadvantageously a Schottky gate electrode at a submicron size is difficult to be formed.

Proposal 5 permits the closest possible arrangement of the drain and Schottky gate electrodes, which, in fact, are separated by the thickness of the insulation coating around the Schottky gate. In this connection, if defect should appear in the thin insulation coating, the semiconductor device would be liable to break down electrically when used. Therefore, if such MESFETs are built in integrated circuits, the dead loss of production will inevitably rise. The layer lying under the ohmic-contact source and drain electrodes is not heavily doped with impurities, thus not permitting the decrease of the contact resistance. As a result, the parasitic series resistance cannot be reduced as much as required.

SUMMARY OF THE INVENTION

Accordingly, it is an object of the present invention to provide an improved MESFET structure which permits the reduction of the Schottky gate length to a submicron size and at the same time, the substantial reduction of parasitic series resistance.

Another object of the present invention is to provide a method of making the same.

To attain the objects of the present invention, a Schottky gate field effect transistor according to the present invention comprises a substrate, an active layer formed in one surface of the substrate, a Schottky gate electrode in the form of an inverted trapezoid on the active layer, a heavily doped region formed in the one surface of the substrate at each side of the inverted trapezoid Schottky gate electrode separately from the side edge of the bottom of the Schottky gate electrode by a certain distance but in self-alignment with the corresponding side edge of the top of the inverted trapezoid Schottky gate electrode, a source electrode on one of the heavily doped regions in ohmic contact thereto, and a drain electrode on the other heavily doped region in ohmic contact thereto. Preferably, the edge of each of the source and drain electrodes close to Schottky gate electrode is in alignment with the corresponding side edge of the top of the inverted-trapezoid gate electrode.

A method of producing such Schottky gate field effect transistor according to the present invention comprises the steps of; forming an electrode metal layer on a active layer of a semiconductor substrate; forming a resist pattern for gate electrode on the electrode metal layer; etching the electrode metal layer wiht ion-beam to form a gate electrode having an inversed trapezoid shape; subjecting the active layer to ion-implantation using the resist pattern and the gate electrode as self-alignment mask to provide heavily doped regions on the opposite sides of the gate electrode; removing the resist pattern; annealing the semi-fabricated product; and evaporating an ohmic-contact metal to deposit vertically on the heavily doped regions, thus forming a source electrode and a drain electrode, both well defined with respect to the gate electrode thanks to the use of the gate as self-alignment or registration mask. Preferably, the Schottky gate electrode may be made of a refractory metal, and the ion beam for etching the gate metal electrode is irradiated twice at different incident angles. Specifically, the ion-beam is irradiated to the gate electrode metal layer at a first predetermined slant incident angle with respect to a line perpendicular to the substrate, and then is irradiated to the remaining metal layer on the other side of the resist pattern from a second direction in symmetry to the first slant incident angle direction with respect to the perpendicular line.

With the geometric shape of the gate electrode as described above, the distance between the source electrode and the Schottky gate electrode and the distance between the drain electrode and the Schottky gate electrode are not only assured but also reduced to a possible minimum. Accordingly, the size of a MESFET reduces, and therefore the number of semiconductor devices per unit area in an integrated circuit increases. As a consequence, the wiring length is shortened, and accordingly, the operating speed of the integrated circuit increases. Also, the dead loss of production may be expected to reduce. When use is made of an optical exposing apparatus in patterning, the source and drain electrodes cannot be closer to the gate elctrode below 1.0 micrometer, because of the limited precision of positioning and aligning in the optical exposing apparatus. In a MESFET according to the present invention, since the source and drain electrodes are formed in self-alignment with the gate electrode, such a safety distance of not less than 1 micrometer is not required between the gate electrode and the source electrode and the gate electrode and the drain electrode. Further, the region of the semiconductor substrate other than that under the Schottky gate electrode is heavily doped with impurities, and accordingly its contact resistance reduces, and hence the parasitic series-resistance reduces. The substantial reduction of the parasitic resistance permits the semiconductor device to make full use of the voltage between the opposite gate electrodes without losing any fraction of the applied voltage, this establishing an electric field strong enough to perform a good control on the electric current flowing from the source to drain electrode of the semiconductor device.

The above method of making a MESFET according to the present invention permits the formation of a submicron Schottky gate electrode by means of reactive ion-beam etching without necessity of using a submicron pattern. A resist pattern which was used in forming a Schottky gate electrode, and the Schottky gate electrode itself are used together as a mask in the process of ion-implanting the semiconductor substrate, thereby providing the heavily doped regions precisely defined in self-alignment with the Schottky gate electrode. Thus, the high-concentration regions cannot be partly coextensive with the Schottky gate electrode. An ohmic-contact metal is then evaporated to deposit vertically on the whole surface of the semi-fabricated product. Again, the Schottky gate is used as a self-alignment mask to form source and drain electrodes, which are brought closest to the Schottky gate.

It, however, should be noted that after the formation of the Schottky gate electrode the resist pattern is removed and then annealing is performed. Therefore, the Schottky gate electrode is preferably made of a refractory metal.

In addition, since the inverted-trapezoid gate electrode is used as a mask in the ion-implantation process, the resultant ion-implanted regions will have such an impurity concentration profile under the slant side wall of the inverted trapezoid gate electrode that the concentration is at maximum on a portion of the substrate directly beneath the side edge of the top of the inverted trapezoid gate electrode because the top side edge of the gate electrode is very thin in thickness of metal, and the concentration will gradually decrease from the maximum concentration portion toward a portion adjacent to the side edge of the bottom of the inverted trapezoid gate electrode. Therefore, it is possible to have a substantially equal impurity concentration from the portion directly beneath the upper side edges of the inverted trapezoid gate metal electrode to the portion immediately adjacent to the corresponding bottom side edge of the same inverted trapezoid electrode, by action of lateral diffusion occurring in the subsequent annealing. Further, since the sectional configuration of the inverted trapezoid gate electrode can be modified by changing the incident angle of the ion beam for the gate electrode etching, the impurity concentration profile can be also controlled in the region from the point directly beneath each top side edge to the point adjacent to the corresponding bottom side edge of the inverted trapezoid gate electrode.

Moreover, the sectional configuration of the inverted trapezoid gate electrode may in symmetry or in asymmetry to the center vertical line. In super-high frequency amplifiers, for example, an increased yielding voltage of the Schottky gate electrode and a decreased gate-drain capacitance Cgd are required. In compliance with such a request, the distance between the drain electrode and the gate electrode can be made larger than that between the source electrode and the gate electrode, by making the aforementioned first and second incident angles of the gate electrode etching ion beam, different from each other.

The above and other objects, features and advantages of the present invention will be apparent from the following description of preferred embodiments of the invention with reference to the accompanying drawings.

DESCRIPTION OF THE PREFERRED EMBODIMENT

Figure 1:
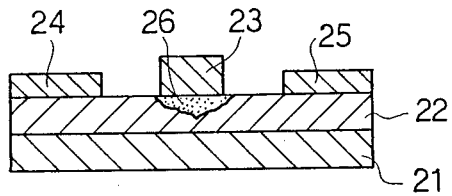
FIG. 1 shows, in section, the basic structure of a MESFET.
Figure 2:
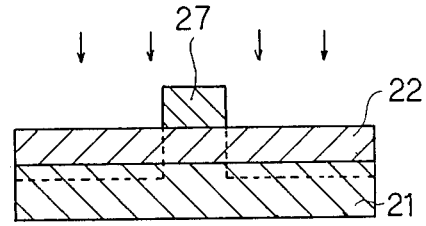
FIGS. 2 to 4 show a conventional method of making a MESFET.
Figure 3:
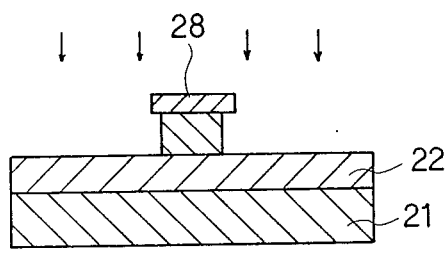
Figure 4:
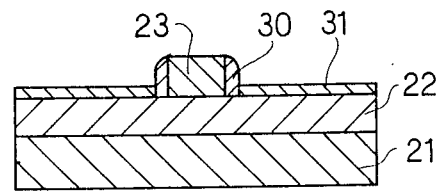
Figure 5A:
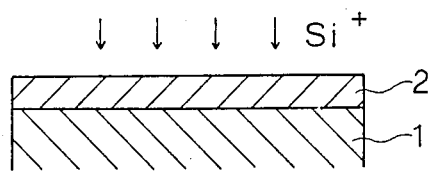
FIGS. 5A to 5J show subsequent steps in making a MESFET, according to the present invention.
Figure 5B:
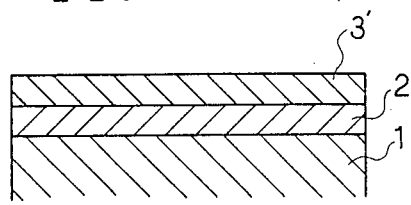

First, explanation will be made on one embodiment of the method for making the MESFET according to the present invention. As shown in FIG. 5A, a single-crystal substrate 1 of III–V compound semiconductor material such as GaAs is ion-implanted with impurities such as Si+ according to the ion-implantation method, thus forming an active layer 2. Then, as shown in FIG. 5B, the active layer 2 of the GaAs substrate 1 is coated with a refractory electrode metal 3' such as WSi according to any conventional method appropriate for the purpose, so that the resultant metal layer is about 5000 Å thick and makes a Schottky contact with the active layer on the GaAs substrate.

Figure 5C:
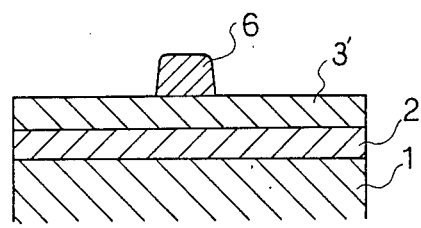
Figure 5D:
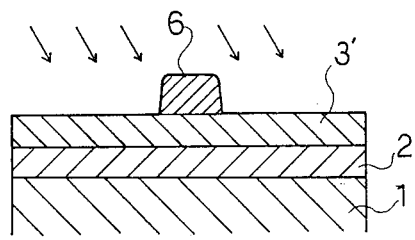
Figure 5E:
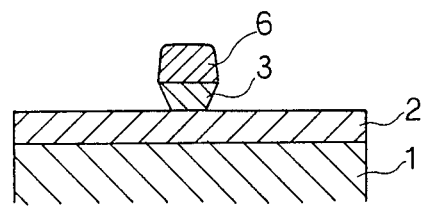
Figure 5F:
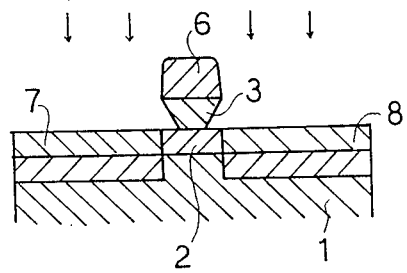

Thereafter, as shown in FIG. 5C, according to a conventional photolithography a resist pattern 6 is formed on a selected area of the metal coating 3' in which a gate is to be formed. Then, as shown in FIG. 5D, the metal-coated substrate is subjected to a reactive ion-beam etching, using $CF_4$ as a reactant gas and using the resist pattern 6 as a mask. The ion-beam is irradiated to the metal-coated substrate at a first predetermined slant angle with respect to a line perpendicular to the substrate, thereby etching out the metal coating 3' on one side of the resist pattern 6 to undercut the same. Again the ion-beam is irradiated to the remaining metal coating on the other side of the resist pattern 6 from a second direction in symmetry to the first incident angle direction with respect to the perpendicular line so that the metal coating is undercut at the other side of the resist pattern. Thus, a Schottky gate electrode 3 is built in the form of inverted trapezoid (See FIG. 5E). Then, high-concentration region 7 and 8 are formed by implanting Si-ions to the semi-fabricated object in a direction vertical to the substrate, using the resist pattern 6 and the Schottky gate electrode 3 as a mask, (See FIG. 5F).

After removing the resist pattern 6, the semi-fabricated product is subjected to annealing in the atmosphere of As at the temperature of 800° C. for twenty minutes, using no protection film. Thus, the impurity is activated. It should be noted that the undercutting amount be controlled so as to put the Schottky gate at so long a distance from the opposite high-concentration regions 7 and 8 that lateral diffusion of the impurity in annealing may reach short of the Schottky gate, thus assuring that the yielding voltage of the Schottky gate does not lower and that the input capacitance of the Schottky gate does not increase. The deterioration of these characteristics would be caused by the extension of the high-concentration regions 7 and 8 to the Schottky gate as a result of diffusion of impurity, and the high-concentration regions would reach the Schottky gate if it were not built in the form of inverted trapezoid.

Figure 5G:
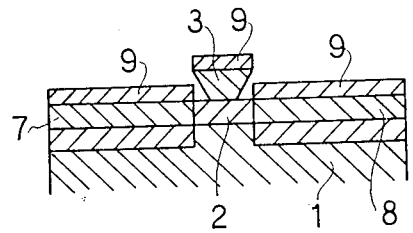

As shown in FIG. 5G, an ohmic-contact metal such as Au-Ge-Au or Au-Ge-Pt is evaporated in as vertical direction as practically possible and is deposited on the semiconductor substrate to form a metal coating 9 about 2000 Å thick. The top of the inverted-trapezoid gate electrode 3 is larger than the bottom thereof, thereby preventing deposition of the metal around the roots of the gate electrode so that no short-circuit can occur between the Schottky gate electrode 3 and each electrode metal 9.

Figure 5H:
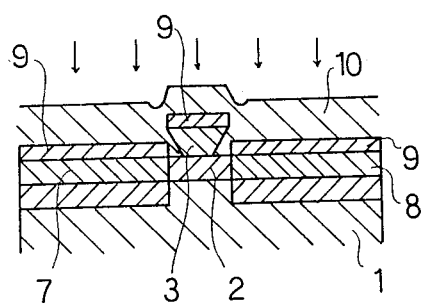
Figure 5I:
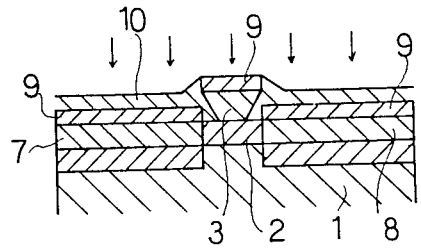
Figure 5J:
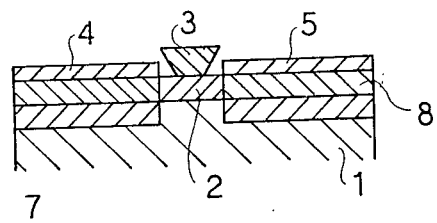

Next, the metal remaining on the top of the Schottky gate 3 must be removed. The remaining metal is removed as follows: First, as shown in FIG. 5H, a resist material is applied to the whole surface of the semi-fabricated product to form a resist coating 10. As a matter of fact the resist coating 10 is relatively thin both on the transient region from the metal electrode 9 to the gate electrode and on the top metal of the gate electrode. The resist-coated object is subjected to ion-etching, using $O_2$ as a reactive gas. First, the resist on the Schottky gate 3 is etched out to disappear (See FIG. 5H). Then, the ohmic-contact metal 9 appears, and the etching is made to stop. The metal is removed by subjecting the partly exposed surface of the semi-fabricated product to argon sputtering (See FIG. 5I). Thereafter, as shown in FIG. 5J, the remaining resist 10 is removed, and the electrode metals 9 are sintered at the temperature of 400° C. for about five minutes for the purpose of alloying. Thus, the source electrode 4 and the drain electrode 5 are formed, and a MESFET results.

As is apparent from the above, in the MESFET shown in FIG. 5J, the regions other than that under the Schottky gate is heavily doped with impurities, and therefore the ohmic contact resistance is low. The source electrode is so close to the Schottky gate that the parasitic series resistance Rs is low, and that the transconductance "$g_m$" and the cutoff frequency "$f_T$" are high. No continuity can appear between the Schottky gate and the source electrode and between the Schottky gate and the drain electrode. Thus, no descent of breakdown voltage is guaranteed. Thanks to the fact that the Schottky gate has an inverted trapezoid shape in section, reduction of the gate size to submicron will not accompany any substantial reduction of its sectional area, and therefore the resistance at the Schottky gate will not increase. With these advantages, a MESFET according to the present invention attains an excellent performance in operation.

Figure 6:
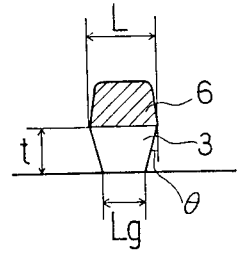

As for a method of making a MESFET according to the present invention a submicron Schottky gate can be formed simply by controlling the slant incident angle with respect to the substrate at which slant incident angle the ion beam is irradiated to etch out the root of the gate electrode metal built on the substrate, without using a submicron resist pattern. Referring to FIG. 6, the length of the inverted trapezoid gate bottom along the GaAs substrate, that is, the effective gate length "Lg" can be given by:

$$Lg = L - 2t \cdot \tan\theta$$

where "L" stands for the size of a resist pattern; "t" for the thickness of the gate metal; and "$\theta$" for the slant incident angle as indicated in FIG. 6.

Assume that, "L" is equal to 1.0 micrometer, and that "t" is equal to 0.5 micrometer. If it is desired to have the gate length 0.5 micrometer long, the direction in which the ion beam is irradiated to the substrate is selected so as to set the angle $\theta$ at 26.5 degrees.

Figure 7:
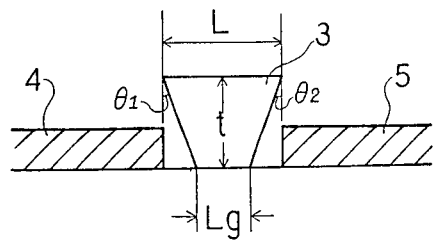
FIGS. 6 and 7 illustrate the relation between the inversed-trapezoid Schottky gate electrode and the direction of ion beam for reactive etching in the method according the present invention.

Turning to FIG. 7, the reactive ion beams can be irradiated at different incident angles $\theta_1$ and $\theta_2$. Specifically, with the angle $\theta_2$ larger than the angle $\theta_1$, the distance between the drain electrode 5 and the gate electrode 3 can be made larger than the distance between the source electrode 4 and the gate electrode 3. In this case, the effective gate length "Lg" can be expressed as follows:

$$Lg = L - t \cdot \tan\theta_1 \cdot t \cdot \tan\theta_2$$

In the above mentioned ion-implantation process for source and drain regions, a surface portion of the substrate 1 beneath each side wall of the inverted-trapezoid gate electrode has such an impurity concentration profile that the concentration is at maximum on a portion of the substrate directly beneath the side edge of the top of the inverted trapezoid gate electrode because the top side edge of the gate electrode is very thin in thickness of metal, and the concentration will gradually decrease from the maximum concentration portion toward a portion adjacent to the side edge of the bottom of the inverted trapezoid gate electrode. Therefore, it is possible to have a substantially equal impurity concentration from the portion directly beneath the upper side edges of the inverted trapezoid gate metal electrode to the portion immediately adjacent to the corresponding bottom side edge of the same inverted trapezoid electrode, by action of lateral diffusion occurring in the subsequent annealing. Further, since the sectional configuration of the inverted trapezoid gate electrode can be modified by changing the incident angle of the ion beam for the gate electrode etching, the impurity concentration profile can be also controlled in the regon from the point directly beneath each top side edge to the point adjacent to the corresponding bottom side edge of the inverted trapezoid gate electrode.

The invention has thus been shown and described with reference to specific embodiments. However, it should be noted that the invention is in no way limited to the details of the illustrated structures but changes and modifications may be made within the scope of the appended claims.

We claim:

1. A method of making a Schottky-gate field effect transistor comprising the steps of:
   forming an active layer on one surface of a substrate;
   forming a Schottky-gate electrode having an inverted trapezoid shape in section directly on the active layer of the substrate, including the steps of
   forming a metal layer on the active layer of the substrate;
   forming a resist pattern on the metal layer, corresponding to the selected position of the Schottky-gate electrode; and
   etching the metal layer with a reactive ion beam, said beam being inclined to said substrate surface, to remove the portion of the metal layer not masked by the resist pattern, such that the remaining portion of the metal layer has the shape in section of an inverted trapezoid;
   forming high-impurity concentration regions in the one surface of the substrate by means of ion-implantation in a direction perpendicular to said substrate surface;
   annealing the semiconductor substrate; and
   depositing an ohmic-contact metal on the high-impurity concentration region on each side of the Schottky gate to form a source electrode and a drain electrode, respectively, using the Schottky gate electrode as a mask, said deposition being in a direction perpendicular to said substrate surface.

2. A method as claimed in claim 1 wherein the reactive ion beam etching is performed in two incident directions which are in symmetry with respect to a line vertical to the one surface of the substrate.

3. A method as claimed in claim 2 wherein the incident angle $\theta$ of the ion beam to the vertical line in the reactive ion beam etching is set to fulfill the following relation:

$$Lg = L - 2t \cdot \tan\theta$$

where
   Lg: gate length
   L: length of the resist pattern
   t: thickness of the gate metal.

4. A method as claimed in claim 2 wherein the incident angle of the ion beam is selected to achieve a selected impurity concentration profile from the portion directly beneath each upper side edge of the inverted trapezoid gate electrode to the portion immediately adjacent to but not contiguous with the corresponding bottom side edge of the same inverted trapezoid electrode.

5. A method as claimed in claim 1 wherein the reactive ion beam etching is performed in two slant directions in asymmetry with respect to a line vertical to the one surface of the substrate, so that the distance between the drain electrode and the gate electrode is larger than that between the source electrode and the gate electrode.

* * * * *

UNITED STATES PATENT AND TRADEMARK OFFICE
CERTIFICATE OF CORRECTION

PATENT NO. : 4,774,200
DATED : September 27, 1988
INVENTOR(S) : Nakajima et al.

It is certified that error appears in the above—identified patent and that said Letters Patent is hereby corrected as shown below:

Column 1, line 25, delete "resistive" (second occurrence).

Column 3, line 16, "only the from the" should read -- only from the --.

Column 4, line 38, "wiht" should read -- with --.

Column 5, line 5, "elctrode" should read -- electrode --.

Column 8, line 33, "$\theta_1 t \cdot \tan$" should read -- $\theta_1 - t \cdot \tan$ --.

Signed and Sealed this

Twenty-first Day of February, 1989

*Attest:*

DONALD J. QUIGG

*Attesting Officer*  *Commissioner of Patents and Trademarks*